(12) United States Patent
Kavalieros et al.

(10) Patent No.: US 7,217,611 B2
(45) Date of Patent: *May 15, 2007

(54) METHODS FOR INTEGRATING REPLACEMENT METAL GATE STRUCTURES

(75) Inventors: Jack Kavalieros, Portland, OR (US); Justin K. Brask, Portland, OR (US); Mark L. Doczy, Beaverton, OR (US); Scott A. Hareland, Lino Lakes, MN (US); Matthew V. Metz, Hillsboro, OR (US); Chris E. Barns, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/748,383

(22) Filed: Dec. 29, 2003

(65) Prior Publication Data
US 2005/0139928 A1   Jun. 30, 2005

(51) Int. Cl.
*H01L 21/8238* (2006.01)
(52) U.S. Cl. ............... 438/216; 438/275; 438/926
(58) Field of Classification Search ......... 438/216, 438/275, 926
See application file for complete search history.

(56) References Cited

U.S. PATENT DOCUMENTS

| | | | |
|---|---|---|---|
| 5,863,823 A | 1/1999 | Burgener | |
| 6,043,157 A * | 3/2000 | Gardner et al. | 438/692 |
| 6,255,698 B1 * | 7/2001 | Gardner et al. | 257/369 |
| 6,261,887 B1 | 7/2001 | Rodder | |
| 6,333,223 B1 | 12/2001 | Moriwaki et al. | |
| 6,383,879 B1 | 5/2002 | Kizilyalli et al. | |
| 6,445,047 B1 | 9/2002 | Yamada et al. | |
| 6,451,641 B1 | 9/2002 | Halliyal et al. | |
| 6,468,851 B1 | 10/2002 | Ang et al. | |
| 6,620,664 B2 | 9/2003 | Ma et al. | |
| 6,953,719 B2 * | 10/2005 | Doczy et al. | 438/199 |
| 2003/0022422 A1 | 1/2003 | Kazuyoshi et al. | |
| 2003/0151098 A1 | 8/2003 | Yukio et al. | |

FOREIGN PATENT DOCUMENTS

EP    0969516    1/2005

OTHER PUBLICATIONS

Int'l Application No.: PCT/US2004/043239 Int'l Preliminary Repot on Patentability Chapter 1 dated Jul. 13, 2006.

* cited by examiner

*Primary Examiner*—Chandra Chaudhari
(74) *Attorney, Agent, or Firm*—Kathy J. Ortiz

(57) ABSTRACT

Methods and associated structures of forming a microelectronic device are described. Those methods comprise providing a substrate comprising a first transistor structure comprising an n-type gate material and second transistor structure comprising a p-type gate material, selectively removing the n-type gate material to form a recess in the first gate structure, and then filling the recess with an n-type metal gate material.

17 Claims, 10 Drawing Sheets

METHODS FOR INTEGRATING REPLACEMENT METAL GATE STRUCTURES

FIELD OF THE INVENTION

The present invention relates to the field of microelectronic devices, and more particularly to methods of fabricating metal gate transistors.

BACKGROUND OF THE INVENTION

Microelectronic devices are often manufactured in and on silicon wafers and on other types other substrates. Such integrated circuits may include millions of transistors, such as metal oxide semiconductor (MOS) field effect transistors, as are well known in the art. MOS transistors typically comprise source, drain and gate regions, in which the gate material may typically comprise polysilicon. Polysilicon gates, however, can be susceptible to depletion effects, wherein an electric field applied to a polysilicon gate sweeps away carriers (holes in a p-type doped polysilicon, or electrons in an n-type doped polysilicon) so as to create a depletion of carriers in the area of the polysilicon gate near an underlying gate dielectric of the transistor. The depletion effect can add to the overall gate dielectric thickness in the MOS device. Recently, silicon germanium source and drain regions have been incorporated within transistors utilizing polysilicon gates, which greatly improves the performance of such transistors since the strained lattice of the silicon germanium regions enhance the electron and hole mobility within the channel of such a transistor, as is well known in the art.

Metal gates, on the other hand, are not as susceptible to depletion effects as gates comprising polysilicon. Typical prior art microelectronic processes, however, do not incorporate both metal gates and polysilicon gates within the same device or integrated circuit. This is due, in part, to the complexity and cost of developing a microelectronic process that can reliably form both a metal gate structure and a polysilicon gate structure within the same microelectronic device or integrated circuit. It would therefore be advantageous to incorporate both a metal gate structure and a polysilicon gate structure with silicon germanium source and drain regions. The methods and structures of the present invention provide such a process.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
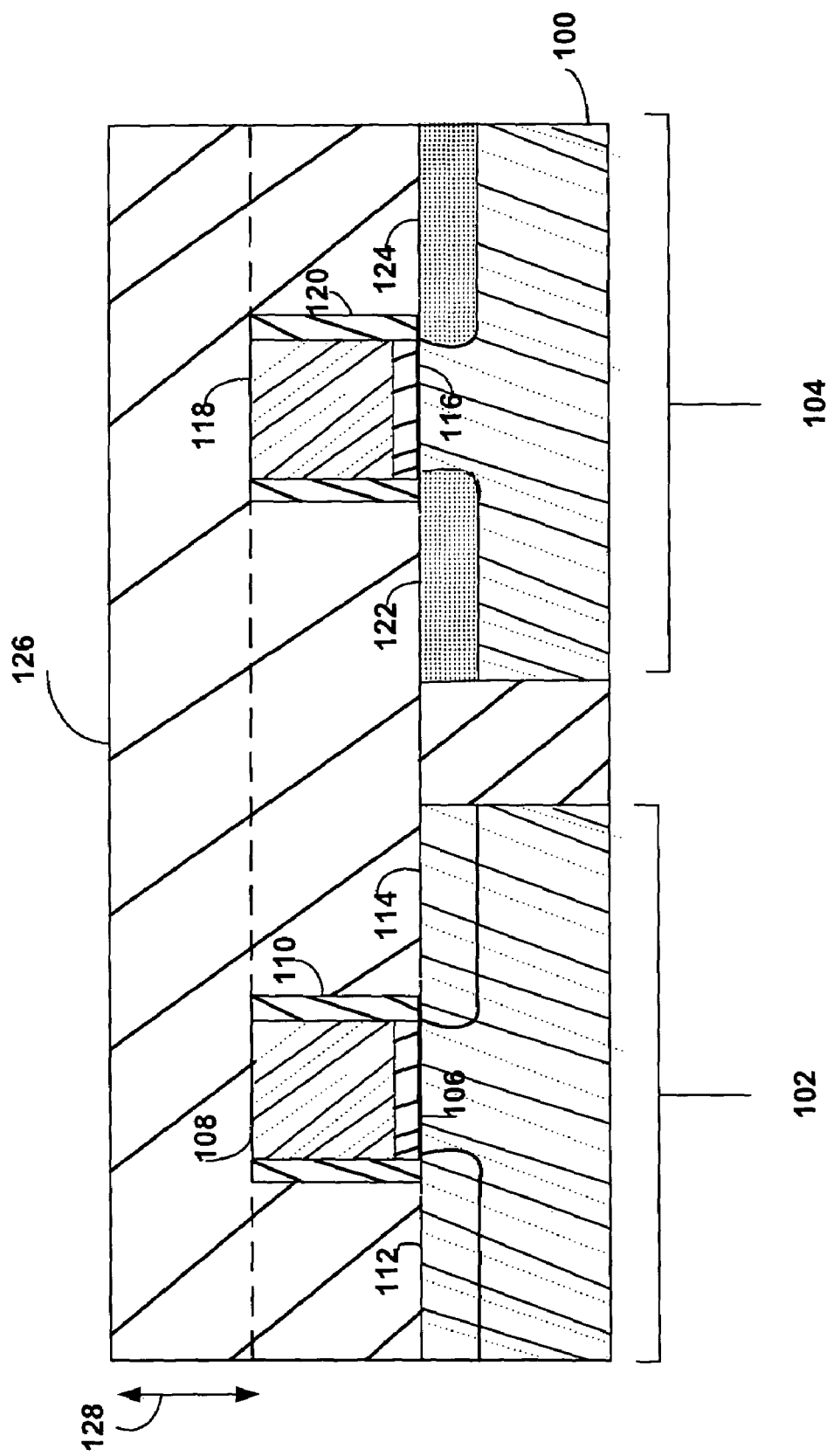
FIGS. 1a–1e represent structures according to an embodiment of the present invention.
Figure 1B:
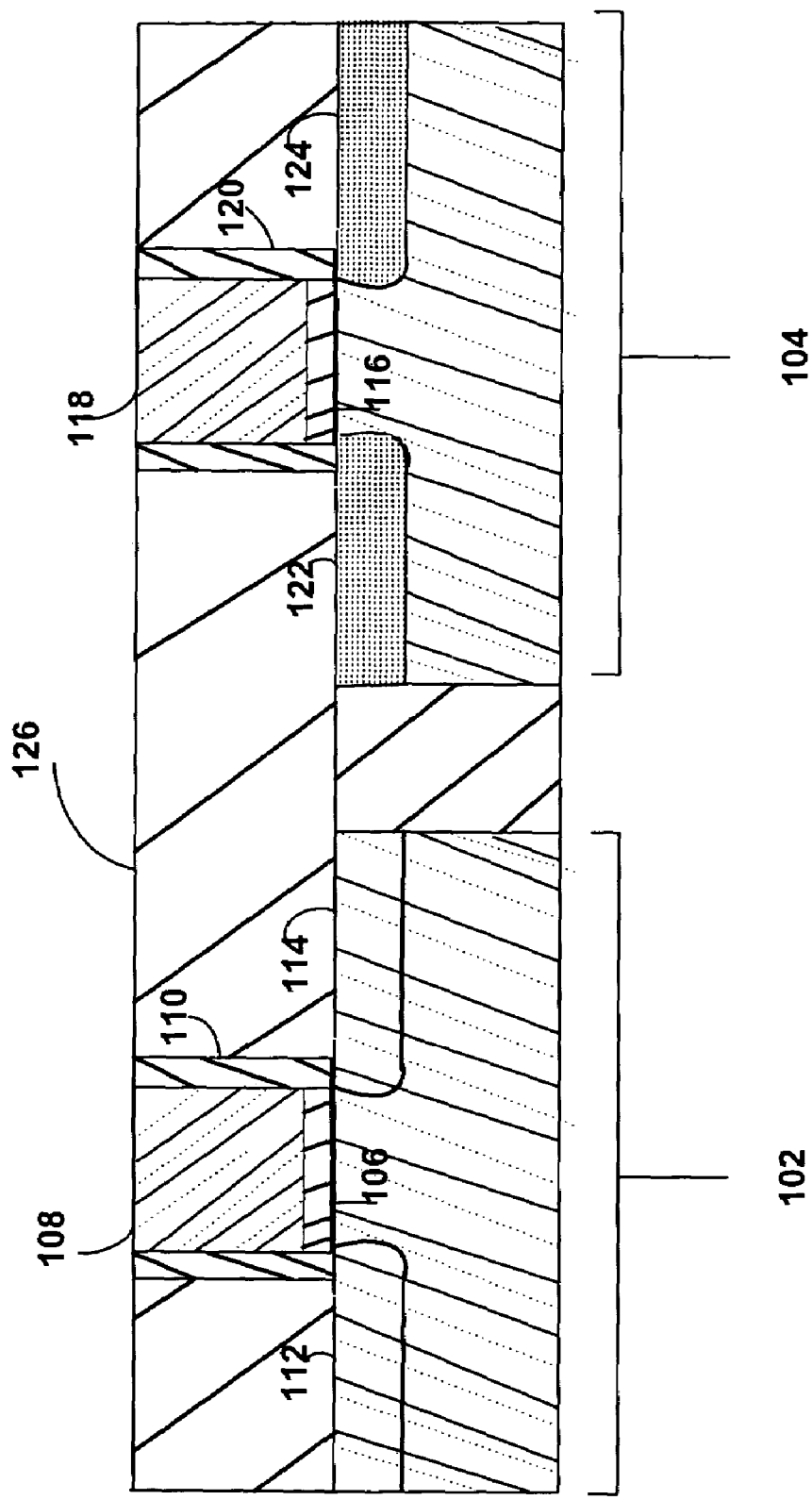

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods comprise providing a substrate comprising a first gate transistor comprising an n-type gate material and second gate transistor comprising a p-type gate material, selectively removing the n-type gate material to form a recess in the first transistor structure, and then filling the recess with an n-type metal gate material. The methods of the present invention enable the incorporation of NMOS metal gate transistors with PMOS polysilicon transistors utilizing silicon germanium source and drain regions, within the same microelectronic device.

FIGS. 1a–1e illustrate an embodiment of a method and associated structures of incorporation of NMOS metal gate transistors with PMOS polysilicon transistors. FIG. 1a illustrates a cross-section of a portion of a substrate 100 that may preferably comprise a silicon substrate 100. The silicon substrate 102 may be comprised of materials such as, but not limited to, silicon, silicon-on-insulator, germanium, indium antimonide, lead telluride, indium arsenide, indium phosphide, gallium arsenide, gallium antimonide, or combinations thereof.

The substrate 100 may comprise a first transistor structure 102 that is preferably an n-type transistor structure 102 (i.e., an NMOS transistor), as is well known in the art. The substrate 100 may also comprise a second transistor structure 104 that is preferably a p-type transistor structure 104 (i.e., a PMOS transistor), as is well known in the art. The n-type transistor structure 102 may comprise a gate dielectric layer 106, a source region 112, a drain region 114, and a spacer 110, as are well known in the art. The n-type transistor structure 102 may further comprise an n-type gate material 108, that is preferably a polysilicon gate material 108, and that is disposed on the gate dielectric layer 106. The n-type gate material 108 may preferably be doped with an n-type dopant, such as phosphorus, for example.

The p-type transistor structure 104 may comprise a p transistor gate dielectric layer 116, a source region 122, a drain region 124, and a spacer 120, as are well known in the art. The source region 122 and the drain region 124 may preferably comprise a silicon germanium alloy material. The p-type transistor structure 104 may further comprise a p-type gate material 118, that is preferably a p-type polysilicon gate material 118, and that is disposed on the p transistor gate dielectric layer 116. The p-type gate material 118 may preferably be doped with a p-type dopant, such as boron, for example.

A dielectric layer 126 may be disposed above and on the n-type and the p-type gate structures, and may comprise an inter-layer dielectric (ILD) as is well known in the art. A portion 128 of the dielectric layer 126 may be removed, by preferably utilizing a chemical mechanical process (CMP), for example, to expose the p-type gate material 118 and the n-type gate material 108 (see FIG. 1b).

Figure 1C:
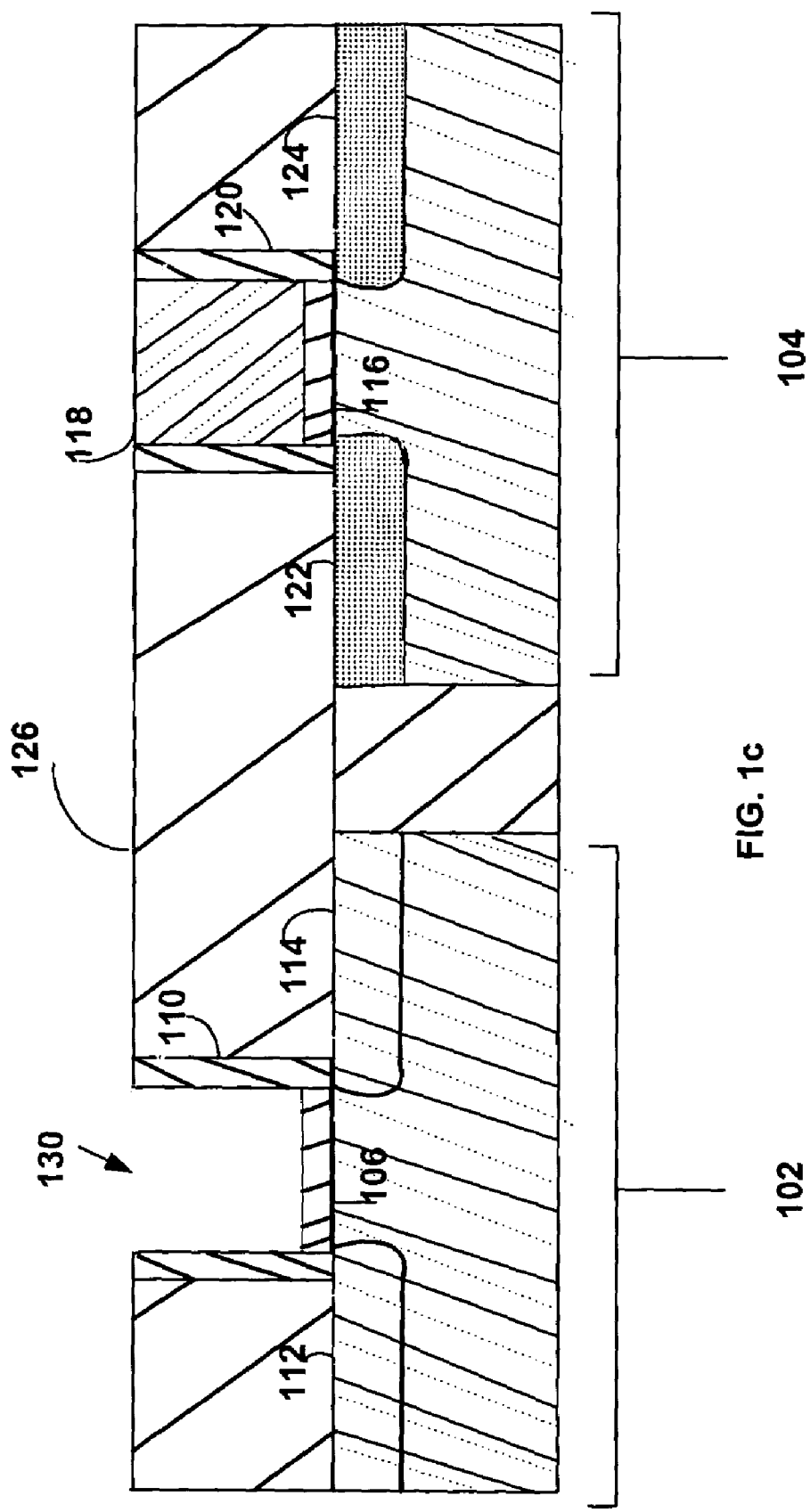

After the p-type gate material 118 and the n-type gate material 108 are exposed, the n-type gate material may be selectively removed from the n-type transistor structure 102 to form a recess 130 (FIG. 1c). The n-type gate material 108 may be selectively removed by utilizing a wet etch, that preferably comprises an ammonium hydroxide etch. In one embodiment, the ammonium hydroxide etch may comprise about 2 percent to about 30 percent ammonium hydroxide in deionized water, and sonication, as is known in the art, may be applied to the mixture with a power that may range from about 0.5 MHz to about 1.2 MHz. The temperature of the wet etch may preferably range from about 10 degrees to about 40 degrees Celsius.

In another embodiment, the wet etch may comprise a mixture of about 15 percent to about 30 percent tetramethylammonium hydroxide (TMAH) in deionized water, with an applied a sonication from about 0.5 MHz to about 1.2 MHz, and a temperature from about 60 degrees to about 90 degrees Celsius. The particular parameters of the removal process may depend upon the particular application, but any such removal process that is highly selective to the n-type gate material 108, that is, which substantially removes the n-type gate material 108 while leaving the p-type material 118 substantially intact, may be utilized. Alternatively, but much less desirable since it involves an additional lithography step, the p-type devices could be masked off to expose only the n-type devices, eliminating the need for etch selectivity between the two types of devices.

Figure 1D:
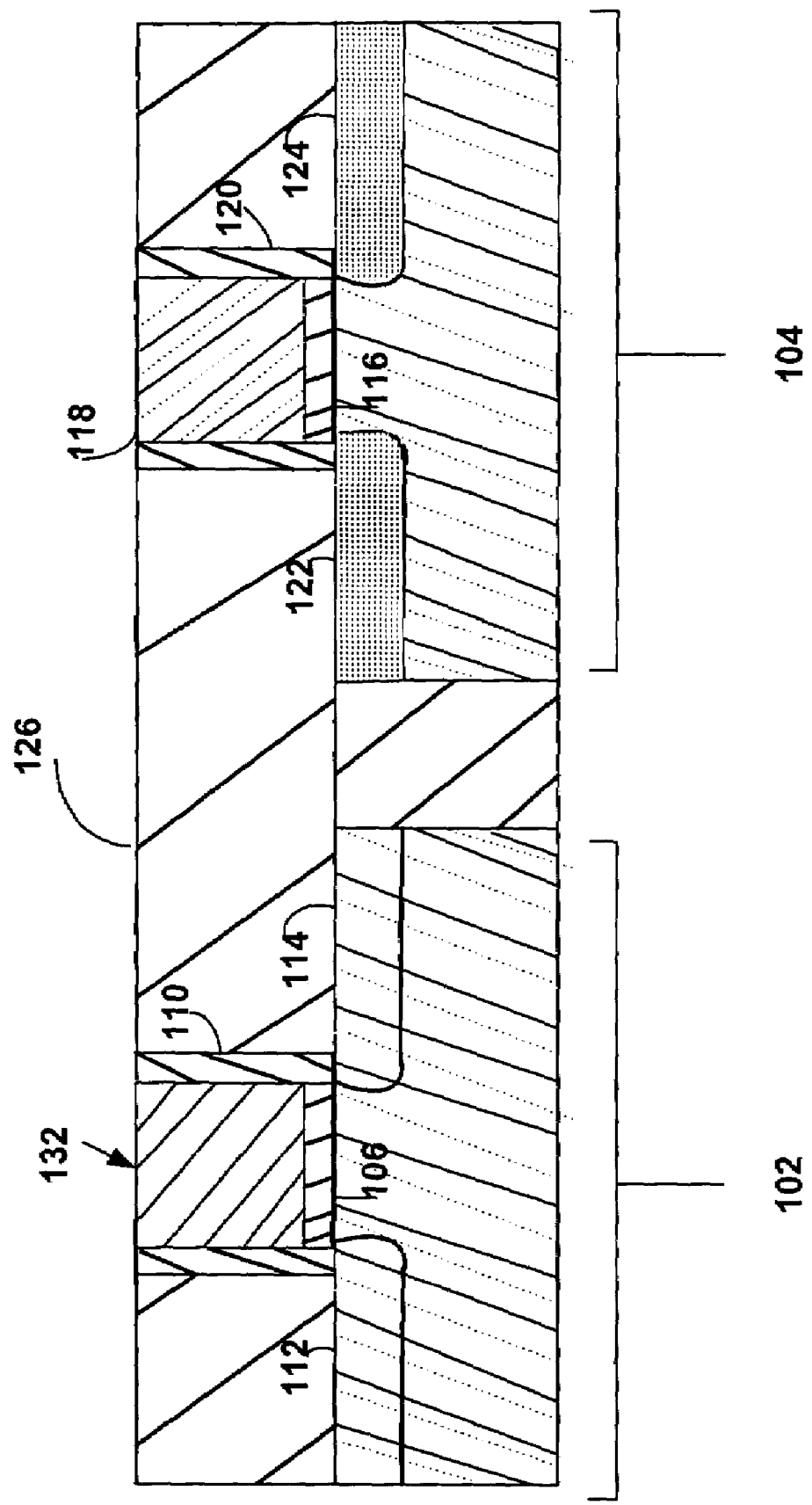

The recess 130 may be filled with an n-type metal gate material 132, such as hafnium, zirconium, titanium, tantalum, or aluminum, or combinations thereof, for example (see FIG. 1d). The recess 130 may be filled using PVD ("Physical vapor deposition"), CVD ("Chemical vapor deposition"), or ALD ("Atomic Layer deposition") as are known in the art. In this manner, the n-type polysilicon gate material 108 may be replaced with the n-type metal gate material 132, which greatly enhances the performance of an n-type transistor fabricated according to the methods of the present invention. The methods of the present invention also enable the integration of an n-type (NMOS) metal gate transistor with a p-type polysilicon transistor (PMOS), which may preferably comprise silicon germanium source and drain regions, within the same device.

Figure 1E:
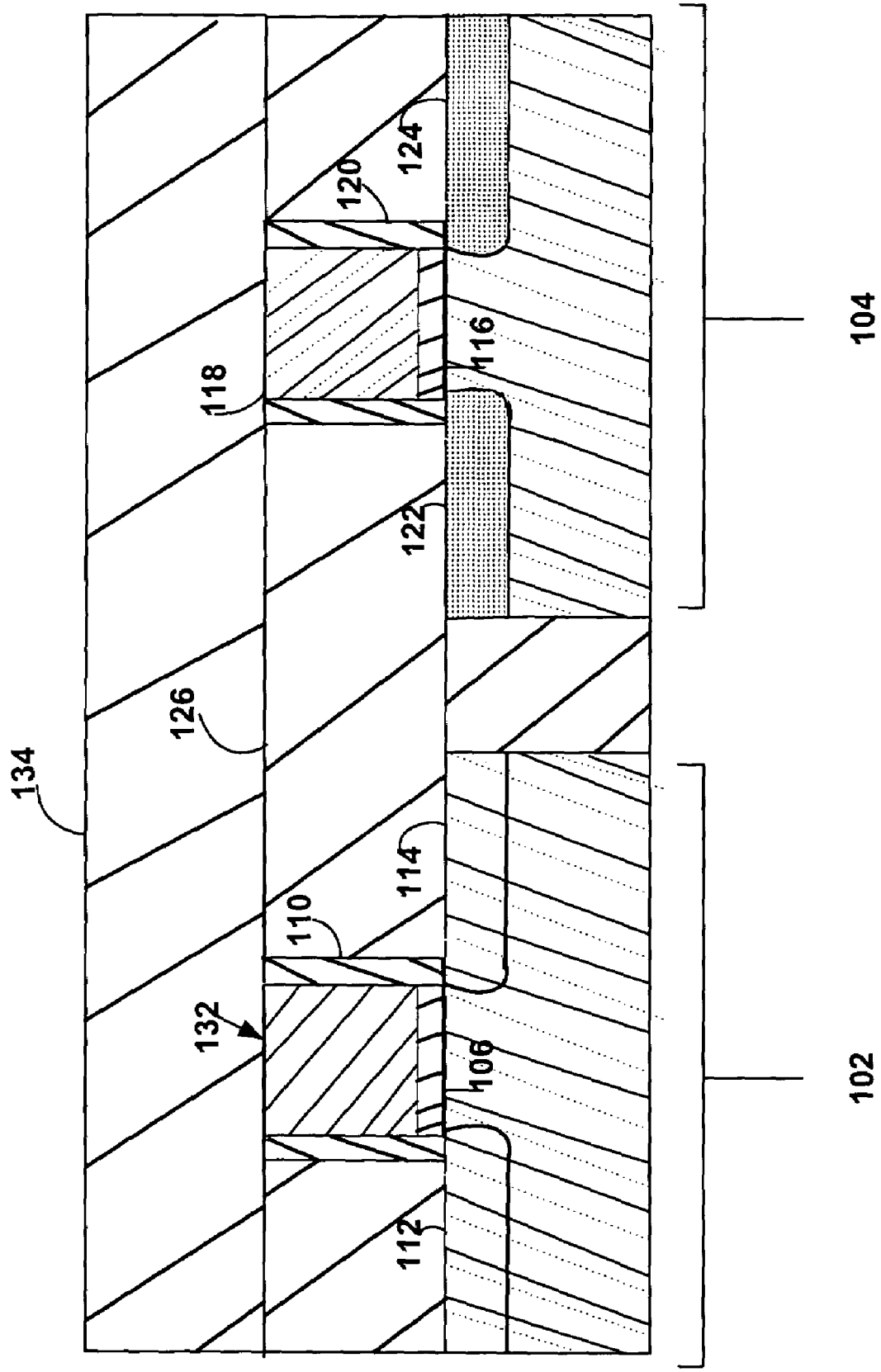

Referring to FIG. 1e, after the recess 130 has been filled with the n-type metal material 132, a second dielectric layer 134 may be formed on the n-type metal gate material 132 and on the p-type gate material 118 (i.e., the ILD layer may be recapped).

Figure 2A:
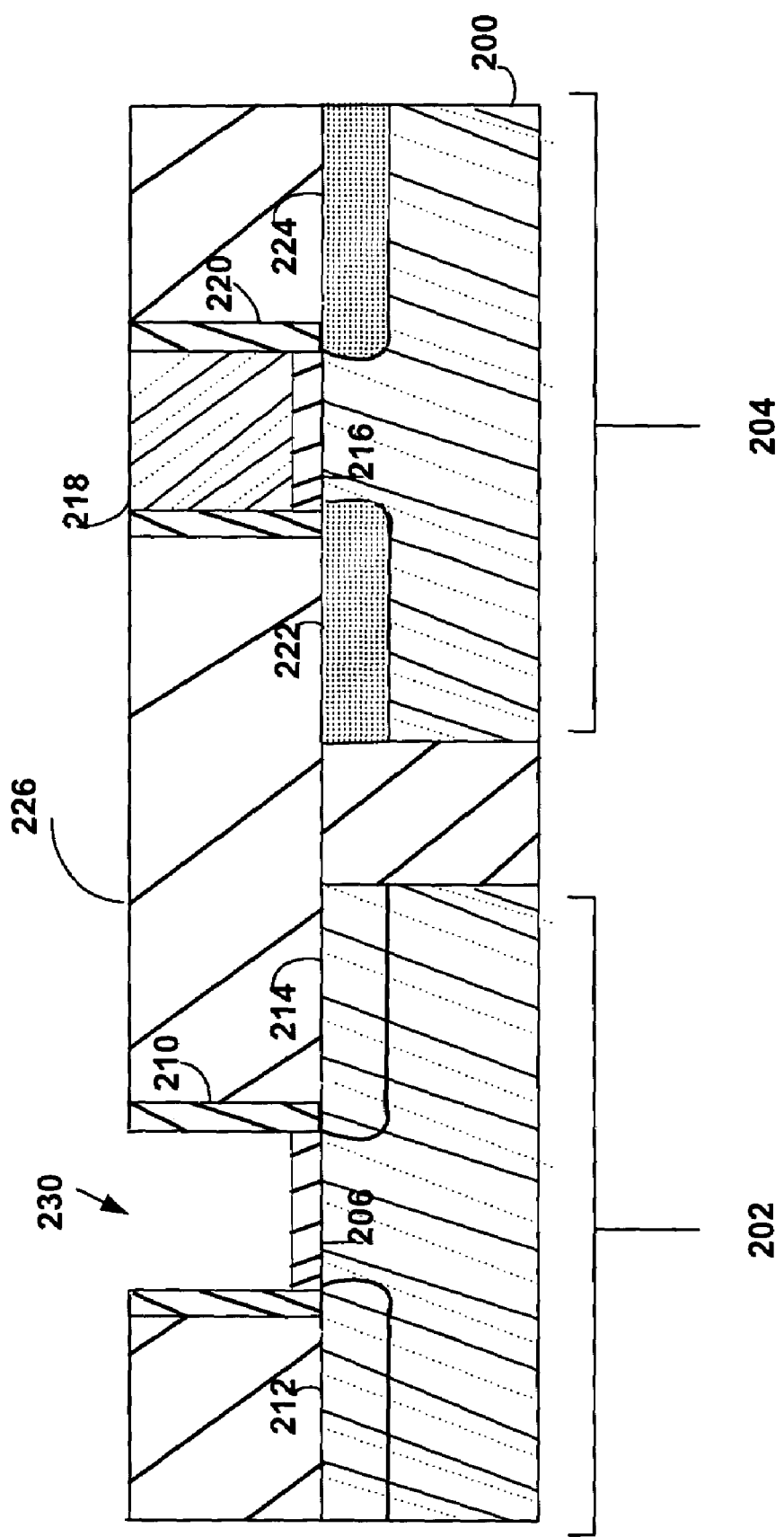
FIGS. 2a–2e represent structures according to an embodiment of the present invention.

In another embodiment (see FIG. 2a), a substrate 200, (similar to the substrate 100 of FIG. 1) may comprise a first transistor structure 202, that is preferably an n-type transistor structure 202, and a second transistor structure 204 that is preferably a p-type transistor structure 204. The n-type transistor structure 202 may comprise a first gate dielectric layer 206, a source region 212, a drain region 214, and a spacer 210. The n-type transistor structure 202 may further comprise a recess 230, similar to the recess 130 of FIG. 1c.

The p-type transistor structure 204 may comprise a p transistor gate dielectric layer 216, a source region 222, a drain region 224, and a spacer 220. The source region 222 and the drain region 224 may preferably comprise a silicon germanium alloy material. The p-type transistor structure 204 may further comprise a p-type gate material 218, that is preferably a p-type polysilicon gate material 218, and that is disposed on the p transistor gate dielectric layer 216.

Figure 2B:
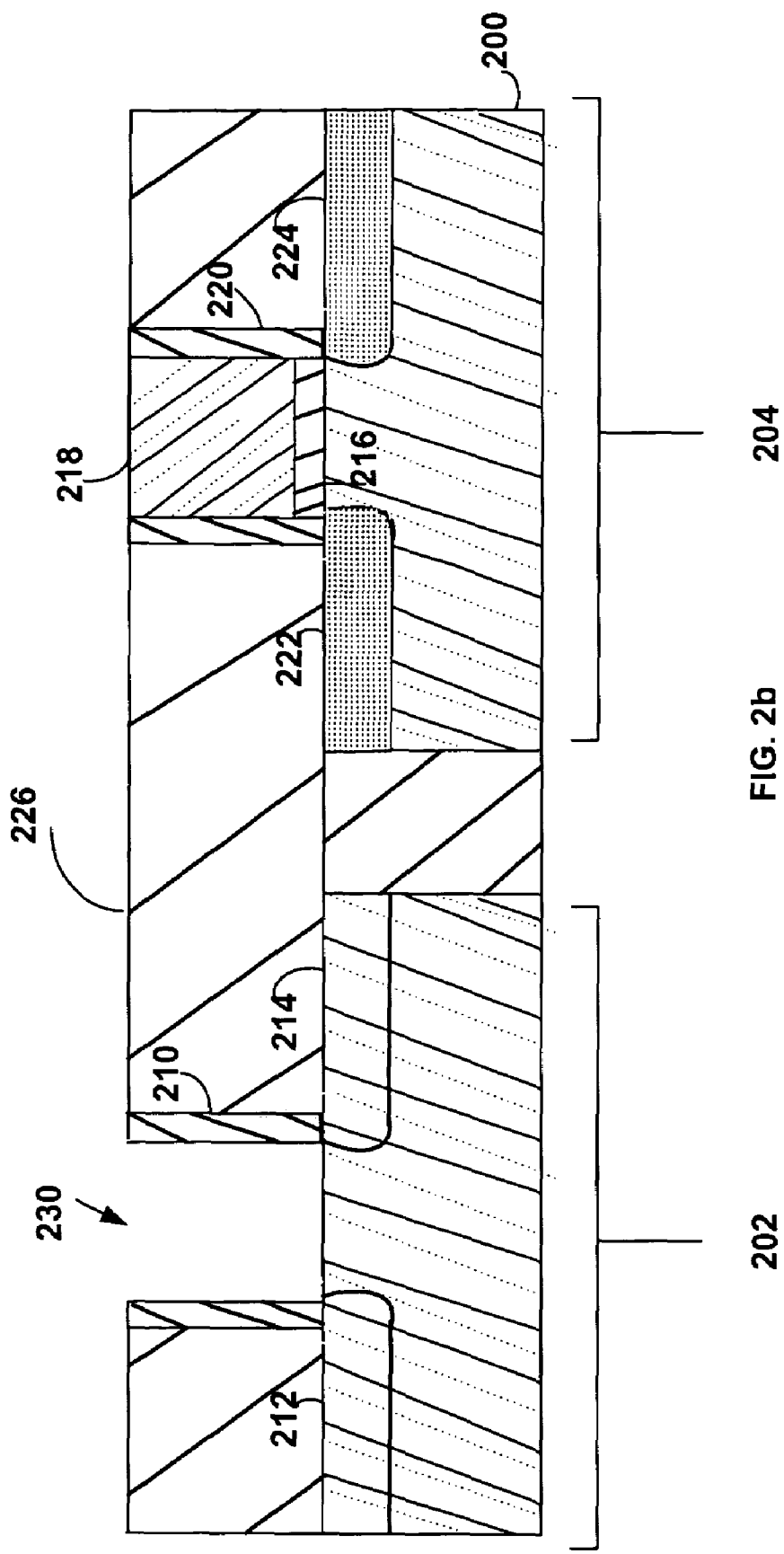
Figure 2C:
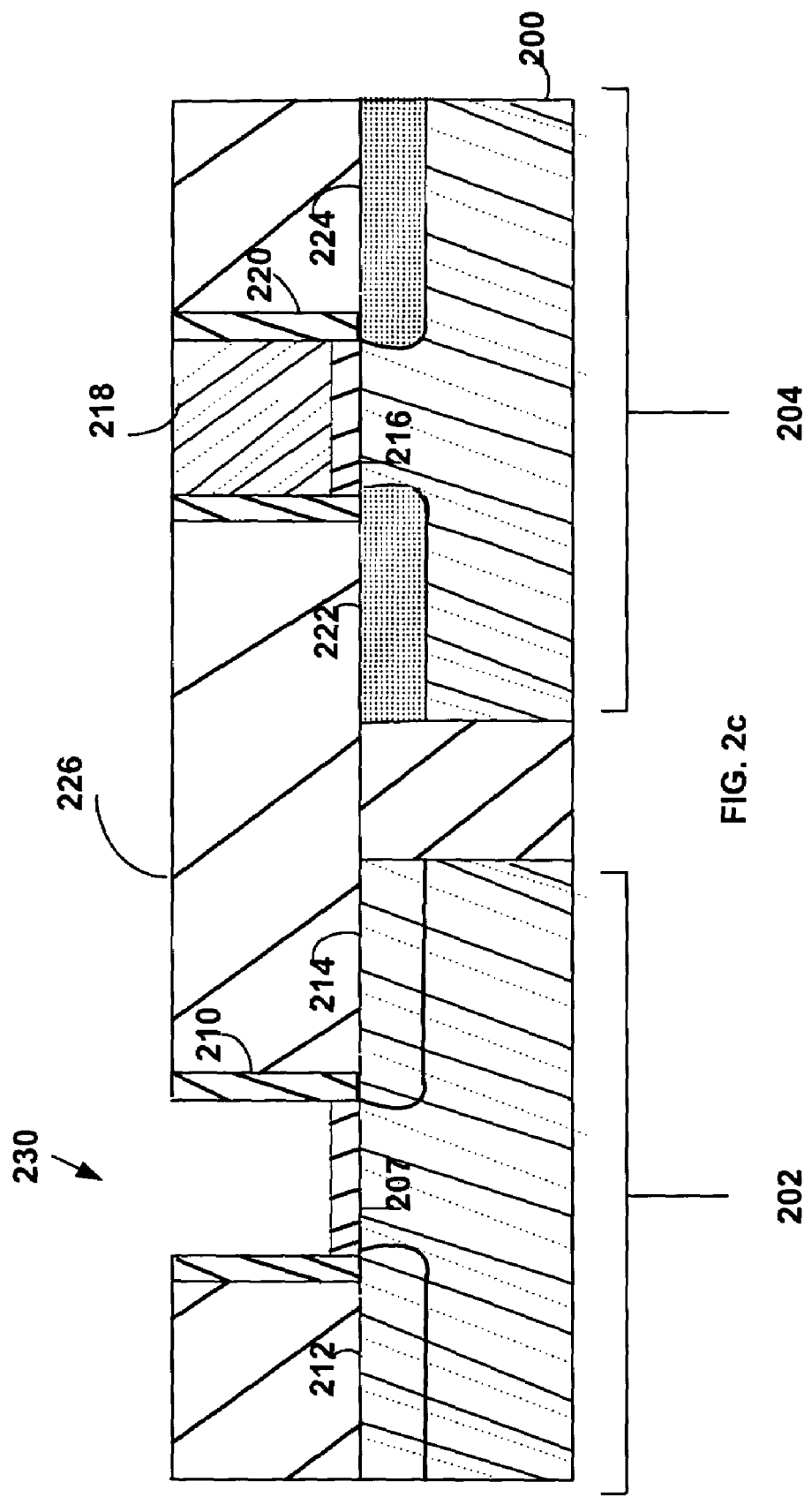

The first gate dielectric layer 206 of the n-type transistor structure 202 may be removed by using techniques well known in the art, such as a wet chemical etch (see FIG. 2b). Then, a second gate dielectric layer 207 may be formed (using conventional methods known in the art) in the recess 230 of the n-type transistor structure 202 (FIG. 2c). The second gate dielectric layer 207 may preferably comprise a high k gate dielectric layer, and may comprise material such as, for example, hafnium oxide, zirconium oxide, titanium oxide, and aluminum oxide and/or combinations thereof. The use of a high k second gate dielectric layer 207 may enhance the performance of the n-type transistor structure 202 by reducing the gate leakage current of devices so fabricated, as is well known in the art.

Figure 2D:
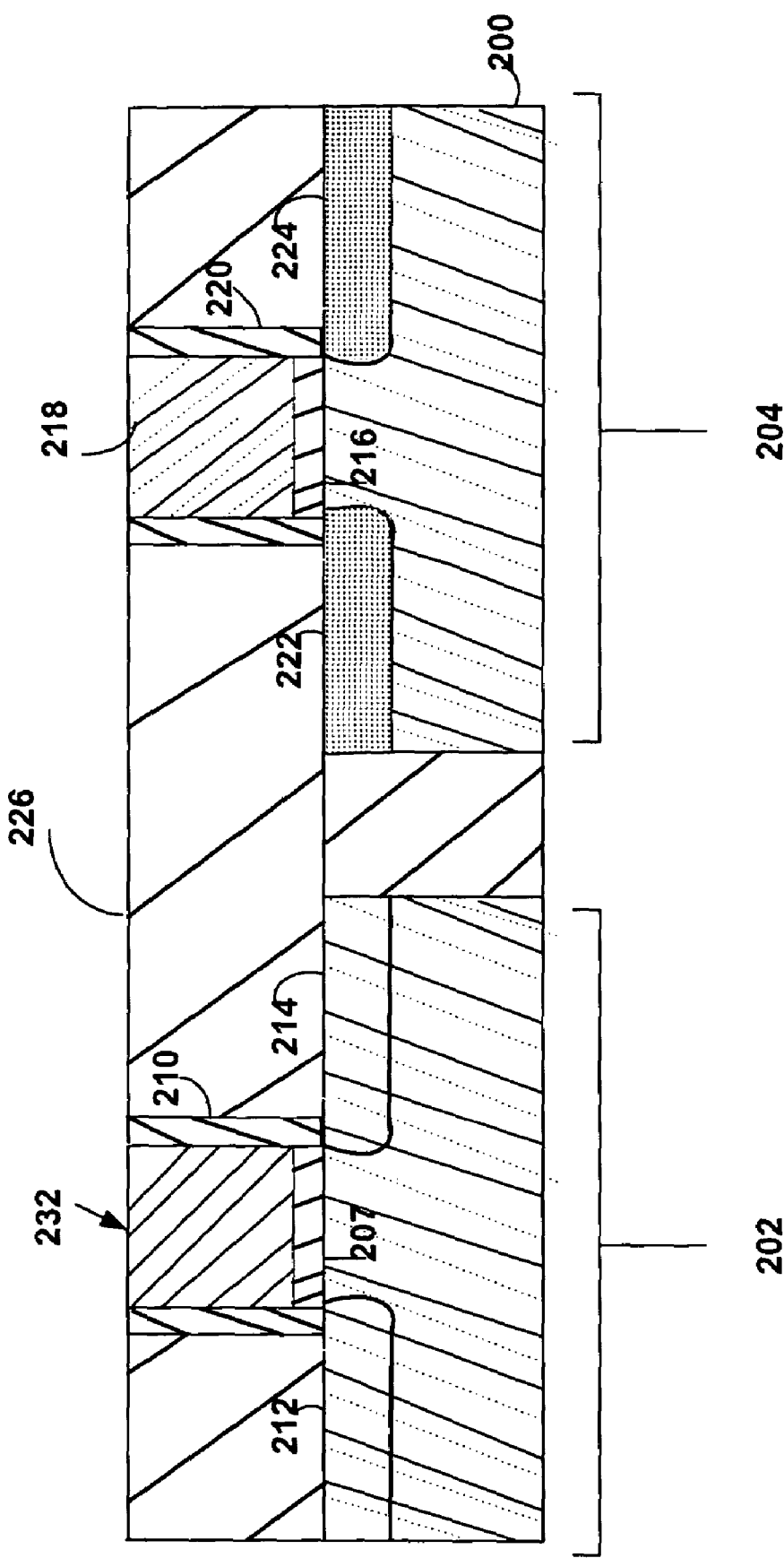
Figure 2E:
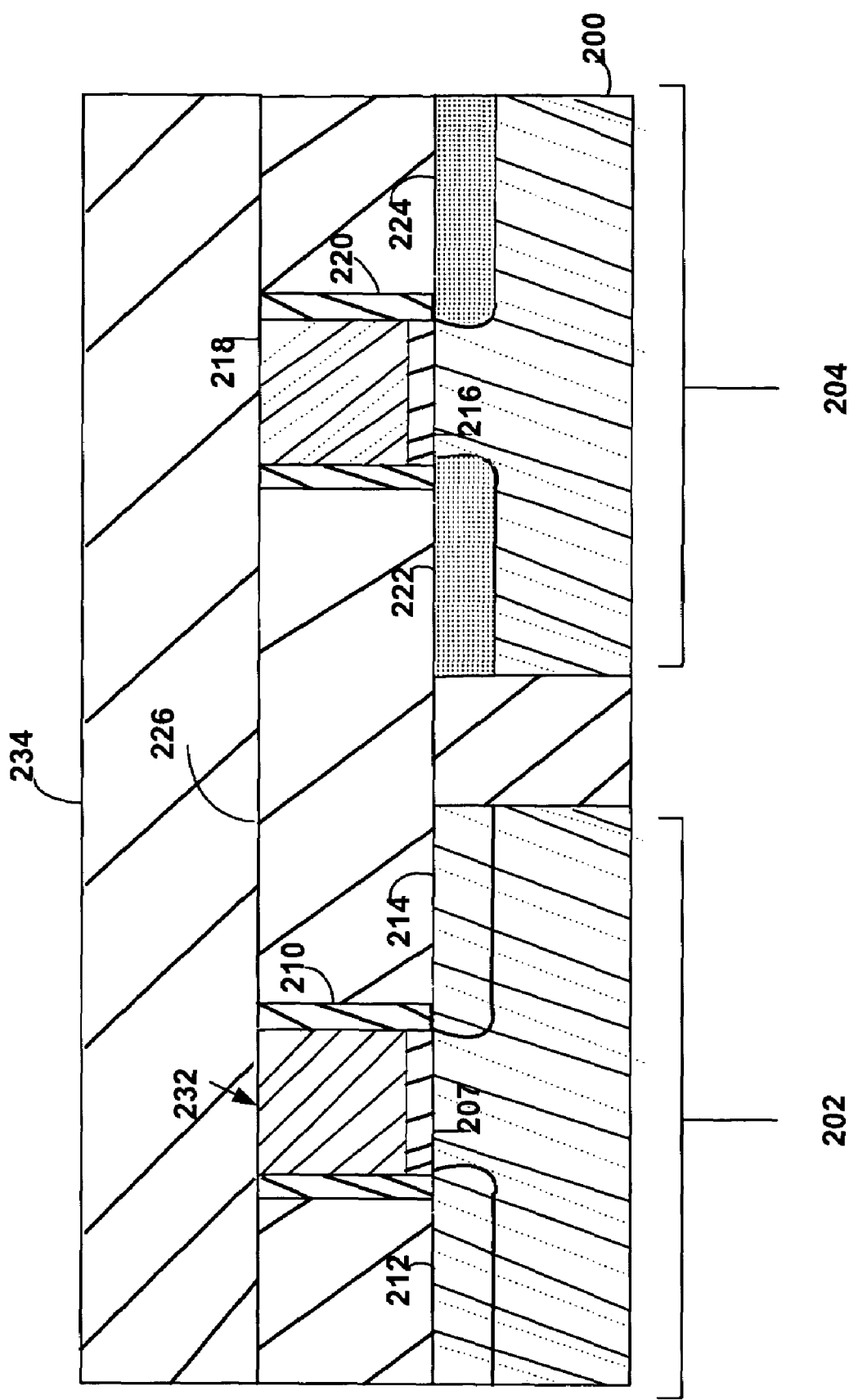

Referring to FIG. 2d, the recess 230 may then be filled with an n-type metal material 232 (similar to the n-type metal gate material 132 of FIG. 1d), and a second dielectric layer 234 (similar to the second dielectric layer 134 of FIG. 1e) may be formed on the n-type metal gate material 232 and on the p-type gate material 218 (see FIG. 2e).

Thus, the current embodiment of the present invention enables the use of a p-type polysilicon gate material with an n-type metal gate material that comprises a high k dielectric gate layer.

As described above, the present invention provides methods and associated structures of providing a substrate comprising a first transistor structure comprising an n-type gate material and second transistor structure comprising an p-type gate material, selectively removing the n-type gate material to form a recess in the first transistor structure, and then filling the recess with an n-type metal gate material. The methods of the present invention enable the replacement of a p-type polysilicon gate material with an n-type metal gate material, which greatly enhances the performance of an n-type transistor fabricated according to the methods of the present invention. The methods of the present invention also enable the integration of an n-type metal gate transistor with a p-type polysilicon transistor, which may preferably comprise silicon germanium source and drain regions, within the same device.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that a microelectronic device, such as a transistor is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method comprising:
   providing a substrate comprising a first transistor structure comprising an n-type gate material and second transistor structure comprising a p-type gate material;
   selectively removing the n-type gate material to form a recess in the first gate structure, wherein both the n-type gate material and the p-type gate material are exposed to the selective removal process; and filling the recess with an n-type metal gate material.

2. The method of claim 1 wherein providing a substrate comprising a first transistor structure comprising an n-type gate material and second transistor structure comprising a p-type gate material comprises providing a substrate comprising an NMOS transistor structure comprising an n doped polysilicon gate material and a PMOS transistor structure comprising a p doped polysilicon gate material.

3. The method of claim 2 wherein providing a substrate comprising an NMOS transistor structure comprising an n doped polysilicon gate material and a PMOS transistor structure comprising a p doped polysilicon gate material comprises providing a substrate comprising an NMOS transistor structure comprising an n doped polysilicon gate material and a PMOS transistor structure comprising a p doped polysilicon gate, wherein the PMOS transistor structure comprises source and drain regions comprising a silicon germanium alloy.

4. The method of claim 1 wherein selectively removing the n-type gate material comprises selectively removing the n-type gate material by wet etching the n-type gate material with a mixture of about 2 percent to about 30 percent ammonium hydroxide in deionized water and applying a sonication from about 0.5 MHz to about 1.2 MHz.

5. The method of claim 4 wherein wet etching the n-type gate material with a mixture of about 10 percent to about 20 percent ammonium hydroxide in deionized water comprises wet etching the n-type gate material with a mixture of about 10 percent to about 20 percent ammonium hydroxide in deionized water at a temperature from about 10 degrees to about 40 degrees Celsius.

6. The method of claim 1 wherein selectively removing the n-type gate material comprises wet etching the n-type gate material with a mixture of about 15 percent to about 30 percent tetramethylammonium hydroxide in deionized water and applying a sonication from about 0.8 MHz to about 1.2 MHz.

7. The method of claim 6 wherein wet etching the n-type gate material with a mixture of about 15 percent to about 30 percent tetramethylammonium hydroxide in deionized water comprises wet etching the n-type gate material with a mixture of about 15 percent to about 30 percent tetramethylammonium hydroxide in deionized water at a temperature from about 60 degrees to about 90 degrees Celsius.

8. The method of claim 1 wherein selectively removing the n-type gate material comprises selectively removing the n-type gate material and not substantially removing the p-type gate material.

9. The method of claim 1 wherein selectively removing the n-type gate material to form a recess in the first gate structure further comprises selectively removing a first gate dielectric layer disposed beneath the n-type gate material.

10. The method of claim 9 wherein selectively removing the first gate dielectric layer disposed beneath the n-type gate material further comprises forming a second gate dielectric layer within the recess.

11. The method of claim 10 wherein forming the second gate dielectric layer within the recess comprises forming a high k gate dielectric layer within the recess.

12. The method of claim 10 wherein selectively removing a first gate dielectric layer disposed beneath the n-type gate material further comprises forming a high k gate dielectric layer selected from the group consisting of hafnium oxide, zirconium oxide, titanium oxide, and aluminum oxide and combinations thereof within the recess.

13. The method of claim 1 wherein filling the recess with an n-type metal gate material comprises filling the recess with a metal gate material selected from the group consisting of hafnium, zirconium, titanium, tantalum, and aluminum.

14. A method of forming a microelectronic structure comprising;

providing a substrate comprising an n-type transistor structure comprising an n-type polysilicon gate material and a p-type transistor structure comprising a p-type polysilicon gate material, wherein a first dielectric layer is disposed above the n-type and the p-type gate structures;

removing a portion of the first dielectric layer so that the n-type polysilicon gate material is exposed;

selectively removing the n-type polysilicon gate material to form a recess, wherein both the n-type gate material and the p-type gate material are exposed to the selective removal process; and filling the recess with an n-type metal gate material.

15. The method of claim 14 wherein filling the recess with an n-type metal gate material further comprises forming a second dielectric layer on the n-type metal gate material.

16. The method of claim 14 wherein selectively removing the n-type polysilicon gate material comprises selectively removing the n-type polysilicon gate material and not substantially removing the p-type polysilicon gate material.

17. The method of claim 14 wherein selectively removing the n-type polysilicon gate material comprises selectively removing the n-type gate material by wet etching the n-type gate material with a mixture of about 2 percent to about 30 percent ammonium hydroxide in deionized water and applying a sonication from about 0.5 MHz to about 1.2 MHz.

* * * * *